(12) United States Patent
Kong et al.

(10) Patent No.: US 7,724,605 B2
(45) Date of Patent: May 25, 2010

(54) CLOCK-BASED DATA STORAGE DEVICE, DUAL PULSE GENERATION DEVICE, AND DATA STORAGE DEVICE

(75) Inventors: Bai Sun Kong, Gyeonggi-do (KR); Sung Chan Kang, Gyeonggi-do (KR); Byung Hwa Jung, Seoul (KR)

(73) Assignee: Sungkyunkwan University Foundation for Corporate Collaboration, Suwon-si, Gyeonggi-do (KR)

( * ) Notice: Subject to any disclaimer, the term of this patent is extended or adjusted under 35 U.S.C. 154(b) by 108 days.

(21) Appl. No.: 12/034,556

(22) Filed: Feb. 20, 2008

(65) Prior Publication Data

US 2009/0185437 A1 Jul. 23, 2009

(30) Foreign Application Priority Data

Jan. 23, 2008 (KR) ...................... 10-2008-0007162

(51) Int. Cl.
*G11C 8/00* (2006.01)
(52) U.S. Cl. .............................. 365/233.1; 365/189.17; 365/194
(58) Field of Classification Search ............ 365/189.17, 365/194, 233.1
See application file for complete search history.

(56) References Cited

U.S. PATENT DOCUMENTS 6,445,217 B1* 9/2002 Kojima et al. ................. 327/57
2005/0046446 A1* 3/2005 Qureshi et al. ................. 326/95
2006/0220718 A1* 10/2006 Kang et al. .................. 327/218

* cited by examiner

*Primary Examiner*—Hoai V Ho
(74) *Attorney, Agent, or Firm*—Blakely, Sokoloff, Taylor & Zafman LLP (57) ABSTRACT

Disclosed is a clock-based data storage device, which includes a dual pulse generating device and a data starge device having two dynamic nodes for prior chargement/dischargement. The clock-based data storage device includes a dual pulse generating unit which delays a clock signal and then outputs a first clock signal corresponding to inversion of a clock signal and a second clock signal corresponding to the clock signal by using the delayed clock signal when the clock signal shifts, a pull-up wait for outputting a pull-up output signal to an output port, based on the first clock signal outputted from the dual pulse generating unit and an input data signal which has beeb inputted, a pull-down unit for outputting a pull-down output signal to the output port, based on the second clock signal outputted from the dual pulse generating unit and the input data signal inputted which has been inputted, and a latch unit which is disposed between the pull-up and pull-down units, and the output port so as to store at least one output signal outputted from the pull-down unit as well as the pull-down unit.

24 Claims, 5 Drawing Sheets

CLOCK-BASED DATA STORAGE DEVICE, DUAL PULSE GENERATION DEVICE, AND DATA STORAGE DEVICE

CROSS-REFERENCE TO RELATED APPLICATIONS

The present patent application claims priority from Korean Patent Application No. 10-2008-0007162, filed on Jan. 23, 2008.

BACKGROUND OF THE INVENTION

1. Field of the Invention

The present invention relates to a clock-based data storage device, and more particularly to a clock-based data storage device, a dual pulse generation device, and a data storage device, which can reduce internal capacitance and improve loading at an output port so that a switching speed increases, and electric power consumption is reduced and is more effectively used.

2. Description of the Prior Art

Figure 1:
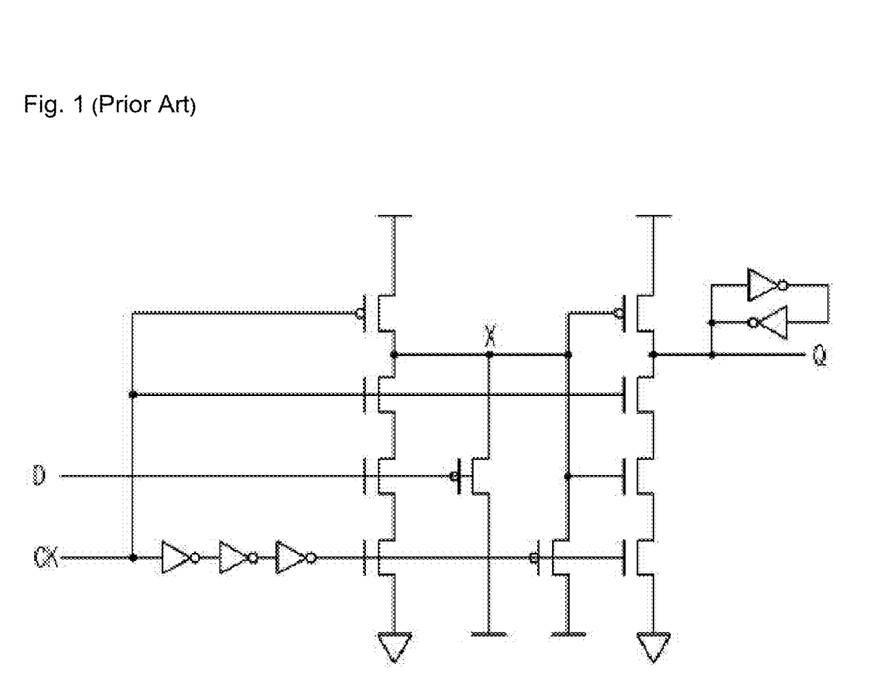
FIG. 1 is a circuit diagram of a conventional hybrid latch flip flop.

FIG. 1 is a circuit diagrams of a Hybrid Latch Flip Flop (hereinafter, referred to as "HLFF"). With reference to FIG. 1, an HLFF includes a dynamic front port and a static back port. When a clock signal Ck shifts from a high level to a lower level in the HLFF as shown in FIG, 1, input data is transmitted to the front port during delay time of an inverted/delayed clock signal CkDB inverted and delayed by three inverters, a charged or, discharged state or a previous state of the front port is kept, and a prior logic state (pull-up or pull-down) of the back port is kept as it is. When the level of a clock signal Ck shifts from a low level to a high level, the front port dose not receive input data D any more, and the back port transmits the previous logic port to the back port so as to output it.

Figure 2:
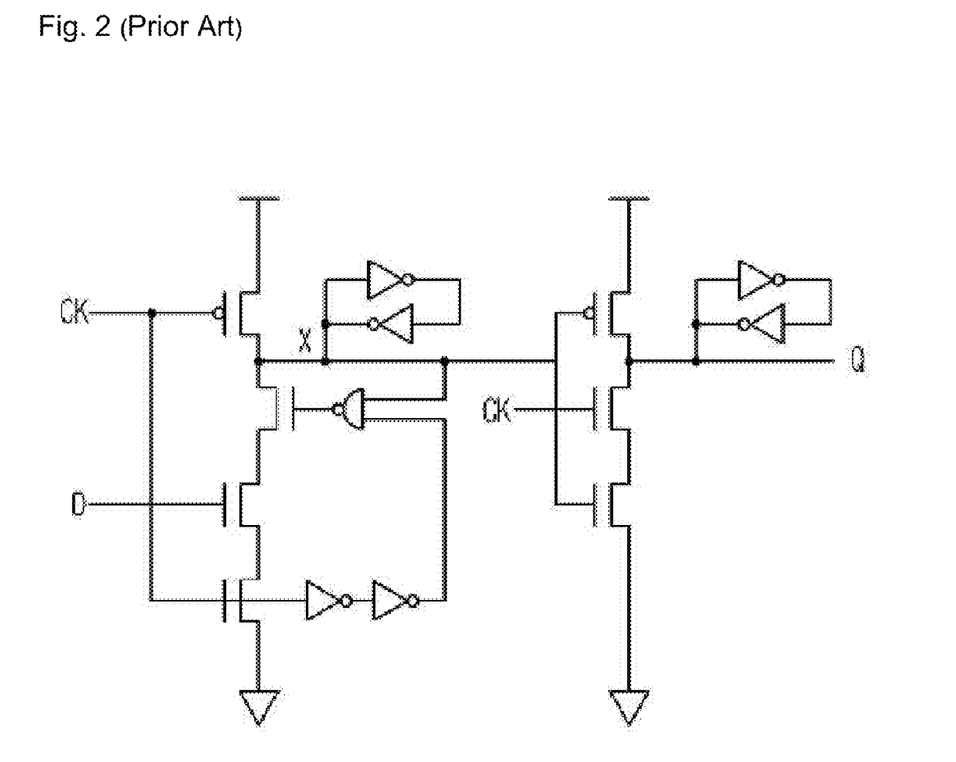
FIG. 2 is a circuit diagram of a conventional semi-dynamic flip flop.

FIG. 2 is a circuit diagram of a conventional Semi-Dynamic Flip Flop (hereinafter, referred to as "SDFF"). With reference to FIG. 2, the SDFF includes a precharge port and an output buffer port. In the SDFF as shown in FIG 2, when input data D is in a logic high state, the precharge port is completely discharged so that output Q becomes a logic high state (pull-up), and when input data D is in a logic low state, the precharge port is charged to be a logic high state so that ouput Q becomes a logic low state (pull-down).

As shown in FIGS. 1 and 2, the conventional HLFF and SDFF as described above include one dynamic node X so that the one dynamic node X is connected with an output transistor p-channel as well as an output transistor N-channel, thereby generating large internal capacitance which always generates regardless of a pull-up and pull-down shift. Accordingly, in the conventional Flip Flop, a switching speed decreases due to the internal large capacitance, which is always generated, power leakage occurs, and an operational speed decreases due to a discharging path in a stack structure of a transistor disposed at an output port.

SUMMARY OF THE INVENTION

Accordingly, the present invention has been made to solve the above-mentioned problems occurring in the prior art, and the present invention provides a clock-based data storage device, which includes: a dual pulse generating unit which delays a clock signal and then outputs a first clock signal corresponding to inversion of a clock signal and a second clock signal corresponding to the clock signal by using the delayed clock signal when the clock signal shifts; a pull-up unit for outputting a pull-up output signal to an output port, based on the first clock signal outputted from the dual pulse generating unit and an input data signal which has been inputted; a pull-down unit for outputting a pull-down output signal to the output port, based on the second clock signal outputted from the dual pulse generating unit and the input data signal which has been inputted; and a latch unit disposed between the pull-up and pull-down units and the output port so as to store at least one output signal outputted from the pull-down unit and the pull-down unit.

Also, the present invention provides a dual pulse generating device, which includes: a clock, delaying unit having at least one inverter so as to delay a clock signal; and a clock outputting unit which, when the clock signal falls, outputs a first clock signal corresponding to inversion of the clock signal through a first outputting port and a second clock signal corresponding to the clock signal through a second output port by using a delay clock signal which has been delayed in the clock delaying unit.

Also, the present invention provides a data storage device, which includes: a pull-up unit for outputting a pull-up output signal to an output port, based on an input data signal inputted when a first clock signal is inputted, the pull-up unit including a first dynamic rode which is previously charged, based on the inputted clock signal, except for a time of the first clock signal being inputted; a pull-down unit for outputting a pull-down output signal to the output port, based on an input data signal inputted when a second clock signal is inputted, the pull-down unit including a second dynamo node which is previously discharged, based on the inputted clock signal, except for a time of the second clock signal being inputted; and a latch unit disposed between the pull-up and pull-down units and the output port so as to store at least one output signal outputted from the pull-down unit and the pull-down unit.

In accordance with an aspect of the present invention, there is provided a clock-based data storage device, which includes: a dual pulse generating unit which delays a clock signal and then outputs a first clock signal corresponding to inversion of a clock signal and a second clock signal corresponding to the clock signal by using the delayed clock signal when the clock signal shifts; a pull-up unit for outputting a pull-up output signal to an output port, based on the first clock signal, outputted from the dual pulse generating unit and an input data signal which has been inputted; a pull-down unit for outputting a poll-down output signal to the output port, based on the second clock signal outputted from the dual pulse generating unit and the input data signal which has been inputted; and a latch unit disposed between the pull-up and pull-down units and the output port so as to store at least one output signal outputted from the pull-down unit and the pull-down unit.

It is preferably that, in the case of the clock signal falling, the dual pulse generating unit may output a first clock signal corresponding to inversion of the clock signal and a second clock signal corresponding to the clock signal.

It is preferably that, except for the case of the clock signal falling, the dual pulse generating unit may output a signal corresponding to the second clock signal and a signal corresponding to the first clock signal.

It is preferably that the dual pulse generating unit, which may include: a clock delaying unit having at least one inverter so as to delay the clock signal; a first output port for outputting a signal to the pull-up unit; a second output port for outputting a signal to the pull-down unit; a first pull-up transistor which receives the delay clock signal outputted from the clock delay unit through a gate port and has a source port connected with power VCC; a first pass transistor which receives a delay clock signal outputted from the clock delaying unit through a gate port and has a source port connected with the clock input port, into which the clock signal is inputted and a drain port connected with a drain port of the first pull-up transistor; an inverter which has an input port connected with each drain port of the first pull-up transistor and the first pass transistor and an output port connected with the first output port so as to output the first clock signal which has been inverted; and a keeper transistor which receives the first clock signal outputted from the inverter through a gate port, and has a source port connected with power VCC, and a drain port connected with the input port of the inverter and the second output port.

It is preferably that the first pull-up transistor and the keeper transistor may be P-channel transistors, and the first pass transistor may be an N-channel transistor.

It is preferably that the pull-up unit may include a first dynamic node, which is previously charged by a signal outputted from the dual pulse generating unit, except for the case of the clock signal failing, and outputs the pull-up output signal to the output port through the first dynamic node, based on the first clock signal outputted from the dual pulse generating unit and the input data signal when the clock signal falls.

It is preferably that the pull-up unit may output the pull-up output signal to the output port through the first dynamic node when the input data signal is in a low level, based on the first clock signal outputted from the dual pulse generating unit and the input data signal when the clock signal fails, It is preferably that the pull-up unit, which may include; a second pull-up transistor which receives the signal outputted front the first output port of the dual clock generating and has a source port connected with the power VCC and a drain port connected with the first dynamic node; a second pass transistor which receives the signal outputted from the first output port of the dual clock generating unit and has a source port connected with the data input port, through which the input data signal is input, and a drain port connected with the first dynamic node; and a first output transistor which has a gate port connected with the first dynamic node connecting the drain ports of the second pull-up transistor and the second pass transistor with each other, a source port connected with the power VCC, and a drain port connected with the output port.

It is preferably that the second pull-up transistor and the first output transistor may be p-channel transistor, and the second pass transistor may be a P-channel transistor.

It is preferably that the pull-down unit may include a second dynamic node which is previously discharged by a signal outputted from the dual pulse generating unit, except for the case of the clock signal falling, and, outputs the pull-down output signal to the output port through the second dynamic node, based on the second clock signal outputted from the dual pulse generating unit and the input data signal when the clock signal falls.

It is preferably that pull-down unit may output the pull-down signal to the output port through the second dynamic node when the input data signal is in a high level, based on the second clock signal outputted from the dual pulse generating unit and the input data signal inputted when the clock signal falls.

It is preferably that the pull-down unit, which may include: a pull-down transistor which receives a signal, which is outputted from the second output port of the dual clock generating unit, through a gate port, and has a source connected with ground Gnd and a drain port connected with the second dynamic node; a third pass transistor which receives a signal, which is outputted from the second output port of the dual clock generating unit, through a gate port, and has a source port connected with the data input unit, through which the input data signal is inputted, and a drain port connected with the second dynamic node; a second output transistor which has a gate port connected with the second dynamic node connecting the drain ports of the pull-down transistor and the third pass transistor with each other, and has a source port connected with ground Gnd and a drain part connected with the output port.

It is preferably that the third pass transistor may be a p-channel transistor, and the second output transistor and the pull-down transistor may be N-channel transistors.

In accordance with another aspect of the present invention, there is provided a dual pulse generating device, which includes: a clock delaying unit having at least one inverter so as to delay a clock signal; and a clock outputting unit which, when the clock signal falls, outputs a first clock signal corresponding to inversion of the clock signal through a first output port and a second clock signal corresponding to the clock signal through a second output port by using a delay clock signal which has been delayed in the clock delaying unit.

It is preferably that the clock output unit may output the first clock signal corresponding to inversion of the clock signal and the second clock signal corresponding to the clock signal when the clock signal falls.

It is preferably that the clock output unit may output a signal corresponding to the second clock signal to the pull-up unit and outputs a signal corresponding to the first clock signal to the pull-down unit, except for the case of the clock signal falling.

It is preferably that the clock output unit, which may include: a first pull-up transistor which receives the delay clock signal, which is outputted from the clock delaying unit, through a gate port and has a source port connected with power VCC; a first pass transistor which receives a delay clock signal, which is outputted from the clock delaying unit, through a gate port, and has a source port connected with the clock input port, into which a clock signal is inputted and a drain port connected with a drain port of the first pull-up transistor; an inverter which has an input port connected with each drain port of the first pull-up transistor and the first pass transistor and an output port connected with the first output port so as to output the first clock signal which has been inverted; and a keeper transistor which receives the first clock signal outputted from the inverter through a gate port, and has a source port connected with power VCC and a drain port connected with the input port of the inverter and the second output port.

It is preferably that the first pull-up transistor and the keeper transistor may foe P-channel transistors, and the first pass transistor may be an N-channel transistor.

In accordance with another aspect of the present invention, there is provided a data storage device, which; a pull-up unit including a first dynamic node which is previously charged, except for the case of a first clock signal being inputted, based on an inputted clock signal, the pull-up unit outputting a pull-up output signal to an output port, based on an input data signal inputted when the first clock, signal is inputted, a pull-down unit including a second dynamic node which is previously charged, except for the case of a second clock signal being inputted, based on the inputted clock signal, the pull-down unit outputting a pull-down output signal to the output port, based on the input data signal inputted when the second clock signal is inputted; and a latch unit disposed between the pull-up and pull-down units and the output port so as to store at least one output signal outputted from the pull-up unit and the pull-down unit.

It is preferably that, based on the first clock signal and the corresponding inputted input data signal, the pull-up unit may output the pull-up signal to the output port through the first dynamic node, when the input data signal is in a low level.

It is preferably that, based on the second clock signal and the corresponding inputted input data signal, the pull-down unit may output the pull-down signal to the output port through the second dynamic node, when the input data signal is in a high level.

It is preferably that the pull-up unit, which may include: a second pull-up transistor which receives the first clock signal through a gate port, and has a source port connected with power VCC and a drain port connected, with the first dynamic node; a second pass transistor which receives the first clock signal through a gate port, and has a source port connected with a data input port, into which the input data signal is inputted and a drain port connected with the first dynamic node; and a first output transistor which has a gate port connected with the first dynamic node connecting the drain ports of the second pull-up transistor and the second pass transistor with each other, a source port connected with power VCC, and a drain port connected with the output port.

It is preferably that the pull-down unit, which may include: a pull-down transistor which receives the second clock signal through a gate port, and has a source port connected with ground Gnd and a drain port connected with the second dynamic node; a third pass transistor which receives the second clock signal through a gate port, and has a source port connected with the data input port, into which the input data signal is inputted, and a drain port connected with the second dynamic node; and a second output transistor which has a gate port connected with the second dynamic node connecting the drain ports of the pull-down transistor and the third pass transistor with each other, a source port connected with ground Gnd, and a drain port connected with the output port.

It is preferably that the third pass transistor, the second pull-up transistor, and the first output transistor stay be p-channel transistors, and the second, output transistor, the pull-down transistor, and the second pass transistor may be p-channel transistors.

BRIEF DESCRIPTION OF THE DRAWINGS

The above and other objects, features and advantages of the present invention will be more apparent front the following detailed description taken in conjunction with the accompanying drawings, in which.

FIG, 4 is a circuit diagram, of a dual pulse flip flop as a clock-based data storage device according to the present invention.

DETAILED DESCRIPTION OF THE EXEMPLARY EMBODIMENTS

Hereinafter, exemplary embodiments of the present invention will be described with reference to the accompanying drawings.

Figure 3:
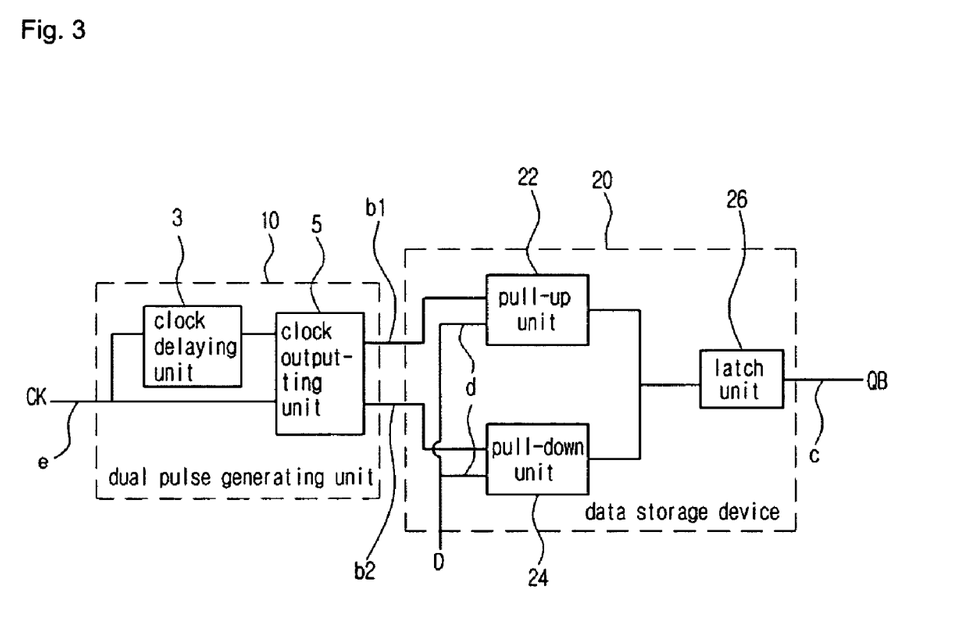
FIG. 3 is a schematic block diagram of a dual pulse flip flop as a clock-based data storage device according to the present invention.

FIG. 3 is a schematic block diagram of a clock-based data storage device according to the present invention.

As shown in FIG. 3, the clock-based data storage device according to the present invention includes a dual pulse generating device 10 and a data storage device 20. The dual pulse generating device 10 delays a crock signal Ck and then outputs a first clock signal corresponding to inversion of the clock signal Ck, and a second clock signal corresponding to the clock signal Ck by using the delayed clock signal when the clock signal Ck shifts. The data storage device 20 includes a pull-up unit 22 for outputting a pull-up output signal to an output port C, based on the first clock signal outputted from the dual pulse generating device 10 and an input data, signal D which has been inputted, a pull-down unit 24 for outputting a pull-down output signal to the output port C, based on the second clock signal outputted from the dual pulse generating device 10 and an input data signal D which has been inputted, and a latch unit 26 diposed between the pull-up and pull-down units 22 and 24 and the output port C so as to store at least one output signal outputted from the pull-up unit 22 and the pail-down unit 24. Such a clock-based data starage device according to the present invention may refer, to a dual pulse flip-flop (DPFF).

Hereinafter, for convenience in description, the title of the dual pulse generating device 10, which is a component of the clock-based data storage device, is designated as a dual pulse generating unit 10 in the description below.

The dual pulse generating unit 10 can output a first clock signal corresponding to inversion of a clock signal Ck and a second clock signal corresponding to the clock signal Ck when the clock signal Ck shifts, i.e. when the clock signal Ck rises or falls. In the present embodiment, it is set up that the first clock signal corresponding to inversion of the clock signal Ck and the second clock signal corresponding to the clock signal Ck are outputted at the time of the clock signal Ck failing from a high level to a low level.

Also, in remaining cases, except the case of the clock signal Ck falling, i.e. in the case of the clock signal Ck rising from the low level to the high level, in the case of the clock signal CK being maintained in the high, level H, and in the case of the clock signal CK being maintained in the low level L, it is preferable that the dual pulse generating unit 10 outputs a signal corresponding to the second clock signal to the pull-up unit 22 and outputs the first clock signal to the pull-down unit 24.

Such dual pulse generating unit 10 includes a clock delaying unit 3 having at least one inverter so as to delay a clock signal Ck and a clock outputting unit 5 which, when the clock signal Ck fails, outputs the first clock signal corresponding to inversion of the clock signal Ck through a first output port b1, and the second clock signal corresponding to the clock signal Ck through a second output port b2 by using a delay clock signal which has been delayed in the clock delaying unit 3.

The pull-up unit 22 is connected with the first output port b1 of the dual pulse generating unit 10 so that the pull-up unit 22 includes a first dynamo node which is previously charged by a signal (a signal corresponding to the second clock signal) outputted from the dual pulse generating unit 10, except for the ease of the clock signal Ck falling, and outputs a pull-up output signal to the output port C through the first dynamic node, based on the first clock signal outputted from the dual pulse generating unit 10 and an input data signal D which has been inputted when the clock signal Ck fails. Herein, it is set up that the pull-up unit 22 outputs the pull-up output signal to the output port c through the first dynamic node when the level of the input data signal is low, based on the first clock signal and the input data signal D which are inputted when the clock signal Ck falls.

The pull-down unit 24 is connected with the second output port b2 of the dual pulse generating unit 10 so that the pull-down unit 24 includes a second dynamic node which is previously discharged by a signal (a signal corresponding to the first clock signal) outputted from the dual pulse generating unit 10, except for the case of the clock signal Ck failing, and outputs a pull-down output signal to the output port C through the second dynamic node, based on the second clock signal outputted from the dual pulse generating unit 10 and an input data signal D which has been when the clock signal Ck falls. Herein, it is set up that the pull down unit 24 outputs the pull-down output signal to the output port C through the second dynamic node in the case where the the level of the input data signal D is high, based on the second clock signal and the input data signal D which are inputted when the clock signal Ck falls. Accordingly, the clock-based data storage device according to the present invention outputs the first clock signal and the second clock signal by using the delay clock signal made by delaying the clock signal Ck in the dual pulse generating unit 10, and includes the pull-up unit 22 and the pull-down unit 24, which have dynamic nodes (the first dynamic node and the second dynamic node) for prior charging/discharging, respectively, so as to output a pull-up signal through the first dynamic node or output a pull-down signal through the second dynamic node according to an input data signal D when a clock signal Ck shifts. Therefore, since a conventional inefficient structure in which a pull-up/pull-down signal is controlled by one dynamic node can be improved, internal capacitance can be reduced, and the load at an output port is improved so that switching speed increases, and electric power consumption can be reduced, so as to be more effective.

Hereinafer, the present invention will be described in more detail with reference to FIG. 4.

The clock delaying unit 3 is connected with a clock input port e, into which a clock signal Ck is inputted, so as to include another one inverter, which is more than one, for delaying an inputted clock signal Ck. Herein, it is preferably that the clock delaying unit 3 has a structure where inverters I1 and I2 for delaying a clock signal Ck can be serially connected with each other.

The clock outputting unit 5 includes: the first output port b1 for outputting a signal PS to the pull-up unit 22; the second output port b2 for outputting a signal PSB to the pull-down unit 24; a first pull-up transistor TU1 which receives a delay clock signal CkD outputted from the clock delaying unit 3 through a gate port and has a source port connected with power Vcc; a first pass transistor TP1, which receives a delay clock signal CkD outputted from the clock delaying unit 3 through a gate port and has a source port connected with the clock input port e, into which a clock signal Ck is inputted, and a drain port connected with a drain pert of the first pull-up transistor TU1; an inverter I3, which has an input port connected with each drain port of the first pull-up transistor TU1 and the first pass transistor TP1 and an output port connected with the first output port b1 so as to output the first clock signal which has been inverted; and a keeper transistor TK, which receives the first clock signal outputted from the inverter I3 through a gate port and has a source port connected with the power VCC and a drain port connected with the input port of the inverter I3 and the second output port b2.

Herein, the first pull-up transistor TU1 and the transistor TK preferably are P-channel transistors, and the first pass transistor TP1 preferably is an N-channel transistor.

The operation of the dual pulse generating unit 10, which is the dual pulse generating device according to the present invention, will be described below.

When a clock signal Ck inputted into the clock input port e falls from a high level H to a low level L, the clock signal Ck in the low level L is delayed by the clock delaying unit 3 so that a delay clock signal CkD in the high level is applied to each gate port of the first pull-up transistor TU1 and the first pass transistor TP1. At this time, the first pull-up transistor TU1 is turned off and the first pass transistor TP1 is turned on during delay time taken for the clock signal Ck in the low level to be delayed by the clock delaying unit 3 when the clock signal Ck falls from the high level H to the low level L. Also, as the clock signal Ck of the low level L passes through the first pass transistor TP1, a second clock signal, i.e. a signal PSB in the low level L is outputted through the second output port b2, and a first clock signal inverted by the inverter I3, i.e. a signal PS in the high level H, is outputted through the first output port b1.

In the case of the clock signal Ck falling from the high level L to the low level L, if delay time taken for the clock signal Ck in the low level to be delayed by the clock delaying unit 3 is passed by so that the low level state is maintained, the delay clock signal CkD also becomes the low level L the same as the clock signal Ck, so that the the first pull-up transistor TU1 is turned on and the first pass transistor TP1 is turned off. Accordingly, as power Vcc of the source port passes through the first pull-up transistor TU1, a signal corresponding to the first clock signal, i.e. a signal PSB in the high level H, is outputted through the second output port b2, and a signal corresponding to the second clock signal, which has been inverted by the inverter I3, i.e. a signal PS in the low level L, is outputted through the first outputing port b1.

During delay time taken for a clock signal Ck to be delayed by the clock delaying unit 3 when the clock signal Ck rises from the low level L to the high level H, the first pull-up transistor TU1 is turned, on and the first pass transistor TP1 is maintained in a turned-off state by the delay clock signal CkD in the low level L. Also, a signal PSB in the high level B is outputted through the second output port b2, and a signal PS in the low level L, which has been inverted by the inverter I3, is outputted through the first output port b1.

In the case of the clock signal Ck rising from the low level L to the high level H, if delay time taken for the clock signal Ck in the high level to be delayed by the clock delaying unit 3 passes by so that the clock signal Ck is maintained in the high level, a delay clock signal CkD also becomes the high level H, the same as the clock signal Ck. Therefore, the first pull-up transistor TU1 is turned off, and the first pass transistor TP1 is turned on However, the clock signal Ck in the high level can not pass through the first pass transistor TP1, the keeper transistor TK used for preventing floating causes outputting of the PSB in the high level H through the second output port b2 to be maintained, and the first output port b1 cusses outputing of the signal PS in the low level L, which has been inverted by the inverter I3, to be maintained.

Herein, each output state of the delay clock signal CkD and the signal PS outputted to the pull-up unit 22, and the signal PSB outputted to the pull-down unit 24, according to the level state of the clock sinal CK may be shown in table 1.

TABLE 1

| CK | H-L(falling) | L | L-H(rising) | H |
|---|---|---|---|---|
| Delay clock signal (CKD) | H | L | L | H |
| PS | H (The first clock signal) | L | L | L |

TABLE 1-continued

| PSB | L (The second clock signal) | H | H | H |
| --- | --- | --- | --- | --- |

The dual pulse generating unit 10, which is the dual pulse generating device according to the present invention, includes the clock delaying unit 3 and the two output ports b1 and b2, outputs the first clock signal in the high level H and the second clock signal in the low level L to each corresponding output port b1 and b2 in the case of a clock signal Ck falling from the high level L to the low level L, and outputs a signal in the low level L and a signal in the high level H to each corresponding output port b1 and b2, except for the case of the clock signal Ck falling.

Figure 4:
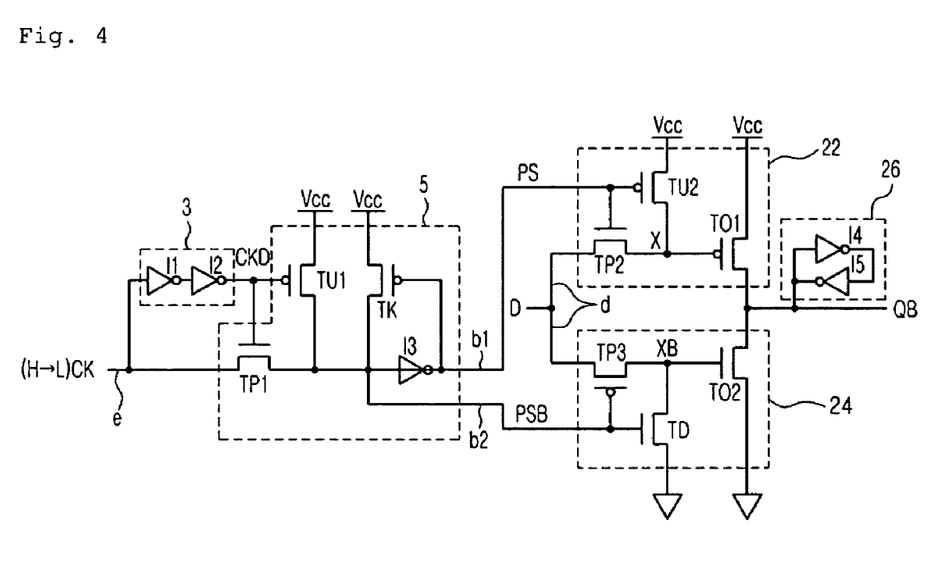

Herein, although the structure of the dual pulse generating unit 10, which includes three inverters I1, I2, and I3, two p-channel transistors TU1 and TK, and one N-channel transistor TP1, is illustrated in FIG. 4, this structure is only one embodiment. Therefore, any kind of circuit element, which has a structure where, in the case of a clock signal Ck failing from a high level L to a low level L, the first clock signal, in the high level H and the second clock signal in the low level L can foe outputted to each corresponding output port b1 and b2, and, except for the case of the clock signal Ck falling, a signal in the low level L and a signal in the high level L can be outputted to each corresponding output port b1 and b2, can also be included in the scope of the present invention.

The pull-up unit 22 includes: a second, pull-up transistor TU2, which has a gate port connected with the first output port b1 of the dual pulse generating unit 10 so as to receive the signal PS, which is outputted from the dual pulse generating unit 10, through the gate port, a source port connected with power Vcc, and a drain port connected with a first dynamic node X; a second pass transistor TP2, which has a gate port connected with the first output port b1 of the dual pulse generating unit 10 so as to receive the signal PS, which is outputted from the dual pulse generating unit 10, through the gate port, a source port connected with a data input port d through which the input data signal D is inputted, and a drain port connected with the first dynamic node X; and a first output transistor TO1, which has a gate port connected with the first dynamic node X connecting the drain ports of the second pull-up transistor TU2 and the second pass transistor TP2 with each other, a source port connected with the power Vcc, and a drain port connected with the output port c.

Herein, the second pull-up transistor TU2 and the first output transistor TO1 preferably are p-channel stransistors and the second pass transistor TP2 preferably is an N-channel transistor.

The pull-down unit 24 includes: a pull-down transistor TD which has a gate port connected with the second output port b2 of the dual pulse generating unit 10 so as to receive a signal PSB, which is outputted from the dual pulse generating unit 10, through the gate port, a source port connected with ground Gnd, and a drain port connected with a second dynamic node XB; a third pass transistor TP3, which has a gate port connected with the second output port b2 of the dual pulse generating unit 10 so as to receive the signal PSB, which, is outputted from the dual pulse generating unit 10, through the gate port, a source port connected with the data input port d through which the input data signal D is inputted, and a drain port connected with the second dynamic node XB; and a second output transistor TO2, which has a gate port connoted with the second dynamic node XB connecting the drain ports; of the pull-down transistor TD and the third pass transistor TP3 with each other, a source port connected with the ground Gnd, and a drain port connected with the output, port c.

Herein, the third pass transistor TP3 preferably is a p-channel transistor and the second output transistor TO2 and the pull-down transistor TD preferably are M-channel transistors.

The latch unit 26 is disposed between the pull-up and pull-down units 22 and 24 and the output port c so as to store at least one output signal outputted from the pull-up unit 22 and the pull-down unit 24.

Hereinafter, operation of the clock-based data storage device according to the present invention, which includes the dual pulse generating unit 10 and the data storage device 20, will be described below.

When a clock signal. Ck is in a high level H, the dual pulse generating unit 10 outputs a signal PS in a low level L through the first output port b1 so as to provide the signal PS to the pull-up unit 22, and outputs a signal USE in a high level H through the second output port b2 so as to provide the signal PSB to the pull-down unit 24. Accordingly, the second pull-up transistor TU2 of the pull-up unit 22 is turned on, the second pass transistor TP2 of the pull-up unit 22 is turned off, the pull-down transistor TD of the pull-down unit 24 is turned on, and the third pass transistor TP3 of the pull-down unit 24 is turned off. As a result, an input data signal D inputted through the data input port d can not pass through the second pass transistor TP2 of the pull-up unit 22 and the third pass transistor TP3 of the pull-down unit 24, the first dynamic node X of the pull-up unit 22 is previously charged to be the high level H, and the second dynamic node XB of the pull-down unit 24 is previously discharged to be the low level L. Also, the first output transistor TO1 of the pull-up unit 22 is turned off as the first dynamic node X connected with the gate port of the first output transistor TO1 is previsouly charged to be the high level H, and the second output transistor TO2 of the pull-down unit 24 is turned off as the second dynamic node XB connected with the gate port of the second output transistor TO2 is previsouly discharged to be the low level L. At this time, an output signal QB may be outputted while having a previous output signal level (the high level H or the low level) which is maintained by the latch unit 26.

In the case of a clock signal Ck failing from the high level H to the low level L, the dual pulse generating unit 10 outputs the first clock signal in the high level H, i.e. a signal PS in the high level H, through the first output port b1 so as to provide it to the pull-up unit 22, and outputs the second clock signal in the low level L i.e. a signal PSB in the low level L, through the second output port b2 so as to provide it to the pull-down unit 24 during delay time taken for the clock signal to be delayed by the clock delaying unit 3. Accordingly, by the signal PS in the high level H, the second pull-up transistor TO2 of the pull-up unit 22 is turned off and the second pass transistor TP2 is turned on. Also, by the signal PSB in the low level L, the pull-down transistor TD of the pull-down unit 24 is turned off and the third pass transistor TP3 is turned on. Therefore, a pull-up or pull-down signal corresponding to the level of the input data signal D can be outputted by the second pass transistor TP2 of the pull-up unit 22 and the third pass transistor TP3 of the pull-down unit 24 which are turned on when the clock signal Ck falls.

For example, when the input data signal D is in the high level H, the second pass transistor TP2 of the pull-up unit 22 is turned off, and the third pass transistor TP3 of the pull-down unit 24 is turned on so that the previously discharged second dynamic node XB of the pull-down unit 24 becomes the high level H. As a result, the second output transistor TO2 is turned on. At this time, an output signal QB outputted through the output port c may be a pull-down output signal in the low level L, and the latch unit 26 may store this output signal.

Meanwhile, when the input data signal D is in the low level L, the third pass transistor TP3 of the pull-down unit 24 is turned off, and the second pass transistor TP2 of the pull-up unit 22 is turned on so that the previously charged first dynamic node X of the pull-up unit 22 becomes the low level L. As a result, the first output transistor TO1 is turned on. At this time, an output signal QB outputted through the output port o may be a pull-up output signal in the high level H, and the latch unit 26 may store this output signal. Particularly, the output signal QB outputted through the output port c when the clock signal Ck falls from the high level H to the low level L is a pull-down output signal in the low level L if the input data signal D is in the high level H, or a pull-up output signal in the high level Pi if it is in the low level L according to a signal level (the high level H or the low level L) of the input data signal D.

When the clock signal Ck is in the low level L, the dual pulse generating unit 10 outputs a signal PS in the low level L through the first output port b1 so as to provide it to the pull-up unit 22, and outputs a signal PSB in the high level H through the second output port b2 so as to provide it to the pull-down unit 24. Accordingly, the second pull-up transistor TU2 of the pull-up unit 22 is turned on, the second pass transistor TP2 of the pull-up unit 22 is turned off, the pull-down transistor TD of the pull-down unit 24 is turned on, and the third pass transistor TP3 of the pull-down unit 24 is turned off. As a result, an input data signal D inputted through the data input port d can not pass through the second pass transistor TP2 of the pull-up unit 22 and the third pass transistor TP3 of the pull-down unit 24, the first dynamic node X of the pull-up unit 22 is previously charged to be the high level H, and the second dynamic node XB of the pull-down unit 24 is previously discharged to be the low level L. Also, the first output transistor TO1 of the pull-up unit 22 is turned off as the first dynamic node X connected with the gate port of the first output transistor TO1 is previously charged to be the high level H, and the second output transistor TO2 of the pull-down unit 24 is turned off as the second dynamic node XB connected with the gata port of the second output transistor TO2 is previously discharged to be the low level L. At this time, an output signal QB nay be outputted while having a previous output signal level (the high level H or the low level L) which is maintained by the latch unit 26.

In the case of a clock signal Ck rising from the low level L to the high level H, the dual pulse generating unit 10 outputs a signal PS in the low level L through the first output port b1 so as to provide it to the pull-up unit 22, and outputs a signal PSB in the high level. H through the second output port b2 so as to provide it to the pull-down unit 24 during delay time taken for the clock signal to be delayed by the clock delaying unit 3. Therefore, the same as the above described state in high level H or in the low level L, the first dynamic node X of the pull-up unit 22 is previously charged to be the high level H, and the second dynamic node XB of the pull-down unit 24 is previously discharged to be the low level L. Also, the first output transistor TO1 of the pull-up unit 22 is turned off as the first dynamic node X connected with the gata port of the first output transistor TO1 is previsouly charged to be the high level H, and the second output transistor TO2 of the pull-down unit 24 is turned off as the second dynamic nods XB connected with the gata port of the second output transistor TO2 is previsouly discharged to be the low level L. At this time, an output signal QB may be outputted while having a previous output signal level (the high level H or the low level) which is maintained by the latch unit 26.

Herein, each output state of she output signal QB according to each level state of a clock signal Ck and each level state of an input data signal D may be shown in table 2.

TABLE 2

| Ck | H-L(falling) | L | L-H(rising) | H |
|---|---|---|---|---|
| D = H | QB = L | previous output signal level is maintained | previous output signal level is maintained | previous output signal level is maintained |
| D = L | QB = H | previous output signal level is maintained | previous output signal level is maintained | previous output signal level is maintained |

The data storage device 20 according to the present invention receives the two clock signals PS and PSB which are inverted with respect to each other, and includes the pull-up unit 22 and the pull-down unit 24 having dynamic nodes X and XB which are previously charged/discharged by the clock signals PS and PSB, respectively, so that the data storage device 20 has a structure allowing each of dynamic nodes X and XB to control pull-up outputting or pull-down outputting according to the level state of an data input signal when the clock signal Ck falls from the high level H to the low level L. Therefore, according to the level state of the data input signal, if an data input signal is the nigh level H, a pull-down output signal in the low level L is outputted through the second dynamic node XB of the pull-down unit 24, and if an data input signal is the low level L, a pull-up output signal in the high level H is outputted through the first dynamic node X of the pull-up unit 22.

Figure 5:
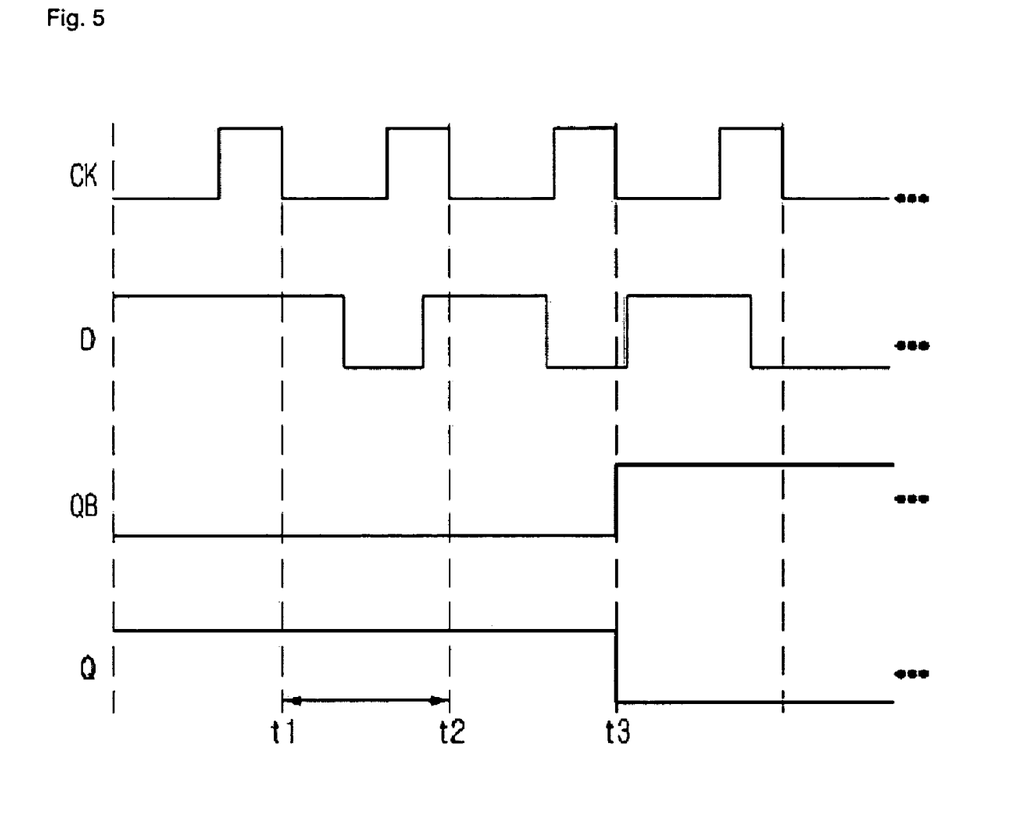
FIG. 5 is a view illustrating a pulse showing output depending on a clock signal in a clock-based data storage device according to the present invention.

Hereinafter, in the clock-based data storage device according to the present invention, the level state of an output signal QB according to a clock signal Ck and an input data signal D, and the level state of an inversion output signal Q corresponding to inversion of the output signal QB will be described below with reference to FIG. 5.

At time t1 when the clock signal Ck inputted into the clock input port e falls, the input data signal D is in a high level H. Therefore, the output signal QB is in a low level L, the inversion output signal Q is in a high level H, and a previous output state is maintained at other time, except the falling time. At time t2 when the clock signal Ck falls again, the input data signal D is also in the high level H. Therefore, the output signal QB is in the low level 1, and the riversion output signal Q is in the high level H. A previous output state is maintained at other times, except the falling time. At a time point t3 when the clock signal Ck fails again, the input data signal D is in the low level L. Therefore, the output signal QB is in the high level H, the inversion output signal Q is in the low level L, and the previous output state is maintained except for the case of falling.

Herein, although the structure of the data storage device 20, which includes the pull-up unit 22 adopting two p-channel transistors TU2 and TO1 and one S-channel transistor TP2 and the pull-down unit 24 adopting two N-channel transistors TD and TO2 and one p-channel transistor TP3, is illustrated in FIG. 4, this structure is only one embodiment. Particularly, any kind of circuit element, which has a structure where two clock signals PS and PSB, which have been inverted with respect to each other, are received, and dynamic nodes X and XB previously charged/discharged by the clock signals PS and PSB, respectively, are included so that each of the dynamic nodes X and XB can control pull-up outputting and pull-down outputting according to the level state of a data input signal when a clock signal Ck falls from a high level to a low level L, can also be included in the scope of the present invention. Meanwhile, in the above-described embodiment, although, the clock-based data storage device according to the present invention Includes the dual pulse generating unit 10 and the data storage device 20 according to the concept that the output signal QB is determined according to the level of the input data signal D when the clock signal Ck falls from the high level H to the low level L, this structure is only one embodiment. Therefore, the dual pulse generating unit 10 and the data storage device 20 can be also structured according to the concept that the output signal QB is determined according to the level of the input data signal D when the clock signal Ck rises, not falls, from the low level L to the high level H. It is natural that this structure is also included in the scope of the present invention.

As described above, the clock-based data storage device according to the present invention employs a structure, in which two clock signals PS and PSB, which are inverted with respective to each other by using a delay clock signal obtained by delaying a clock signal Ck in the dual pulse generating unit 10, are outputted, and the pull-up unit 22 and the pull-down unit 24, which have each dynamic node (the first dynamic node X and the second dynamic node XB) previously charged/discharged by each corresponding clock signal PS and PSB, are included, so that pull-up output and pull-down output can be controlled according to the level state of a data input signal, based on each previous charged/discharged state of the dynamic nodes X and XB when the clock signal Ck shifts. Therefore, a conventional inefficient structure where pull-up/pull-down signals are controlled by one dynamic node can be improved.

Particularly, the clock-based date storage device according to the present invention includes dynamic nodes (the first dynamic node X and the second dynamic node XB) so as to control pull-up output and pull-down output, respectively, and not include one dynamic node for controlling pull-up and pull-down signals. Therefore, an internal capacitance can be reduced, there is no need to use an unnecessary circuit element, such as as NAND gate, and it is unnecessary to load at least one output transistor for outputting a pull-down output signal to the source port of the second output transistor of the pull-down unit 24 so that a switching speed can be improved and electric power consumption can be reduced by preventing power loss caused by power leakage.

Also, according to the above described structure including the dual pulse generating unit 10, which is the dual pulse generating device according to the present invention and the data storage device 20, there is not any problem in that a plurality of data storage devices 20 are connected with one dual pulse generating unit 10 so as to be used, and in such the case where the plurality of data storage devices 20 are connected with one dual pulse generating unit 10 so as to be used, efficiency in total electric power consumption and in a valid area for layout arrangement can be maximized.

The clock-based data storage device according to the present invention includes a dual pulse generating device for outputting two signals PS and PSB, which have been inverted with respective to each other, and a pull-up unit 22 and a pull-down unit 24 which have each dynamic node (the first dynamic node X and the second dynamic node XB) previously charged/discharged by each corresponding clock signal PS and PSB outputted from the dual pulse generating device so as to control pull-up output or pull-down output according to the level state of a data input signal, based on each previously charged/discharged state of the dynamic nodes X and XB when a clock signal Ck shifts. Therefore, an internal capacitance can be reduced, there is no need to use an unnecessary circuit element, such as an NAND gate, and it is unnecessary to load another output transistor, which is more than one, for outputting a pull-down outputting signal to the source port of the second output transistor of the pull-down unit 24 so that a switching speed can be improved and electric power consumption can be reduced by preventing power loss caused by power leakage. Also, it is possible to make remarkable progress in a clock-based data storage device, such as a flip flop, and there is a sufficient possibility to make various electronic apparatus employing the present invention come into the market or be commercialized, and the present invention can be surely putted into partical use.

Although exemplary embodiments of the present invention has been described for illustrative purposes, the present invention is not limited in the embodiments, and those skilled in the art will appreciate that various modifications, additions and substitutions are possible, without departing from the scope and spirit of the invention as disclosed in the accompanying claims.

What is claimed:

1. A clock-based data storage device comprising:
   a dual pulse generating unit which delays a clock signal to generate a delayed clock signal and then outputs a first clock signal corresponding to inversion of the clock signal and outputs a second clock signal corresponding to the clock signal by using the delayed clock signal when the clock signal shifts;
   a pull-up unit for outputting a pull-up output signal to an output port, based on the first clock signal outputted from the dual pulse generating unit and an input data signal which has been inputted, wherein the pull-up unit includes an output transistor to output the output signal and having a source node coupled to VCC power;
   a pull-down unit for outputting a pull-down output signal to the output port, based on the second clock signal outputted from the dual pulse generating unit and the input data signal which has been inputted; and
   a latch unit disposed between the pull-up and pull-down units and the output port so as to store at least one output signal outputted from the pull-up unit and the pull-down unit.

2. The clock-based data storage device as claimed in claim 1, wherein, in a case of the clock signal falling, the dual pulse generating unit outputs the first clock signal corresponding to inversion of the clock signal and outputs the second clock signal corresponding to the clock signal.

3. The clock-based data storage device as claimed in claim 2, wherein, except for the case of the clock signal falling, the dual pulse generating unit outputs a signal corresponding to the second clock signal to the pull-up unit and a signal corresponding to the first clock signal to the pull-down unit.

4. The clock-based data storage device as claimed in claim 3, wherein the dual pulse generating unit comprises:
   a clock delaying unit having at least one inverter so as to delay the clock signal;
   a first output port for outputting a signal to the pull-up unit;
   a second output port for outputting a signal to the pull-down unit;
   a first pull-up transistor which receives the delay clock signal outputted from the clock delay unit through a gate port and has a source port connected with power VCC;
   a first pass transistor which receives a delay clock signal outputted from the clock delaying unit through a gate port and has a source port connected with the clock input port, into which the clock signal is inputted and a drain port connected with a drain port of the first pull-up transistor;

an inverter which has an input port connected with each drain port of the first pull-up transistor and the first pass transistor and an output port connected with the first output port so as to output the first clock signal which has been inverted; and a keeper transistor which receives the first clock signal outputted from the inverter through a gate port, and has a source port connected with power VCC, and a drain port connected with the input port of the inverter and the second output port.

5. The clock-based data storage device as claimed in claim 4, wherein the first pull-up transistor and the keeper transistor are P-channel transistors, and the first pass transistor is an N-channel transistor.

6. The clock-based data storage device as claimed in claim 2, wherein the pull-up unit includes a first dynamic node, which is previously charged by a signal outputted from the dual pulse generating unit except for the case of the clock signal falling, and outputs the pull-up output signal to the output port through the first dynamic node, based on the first clock signal outputted from the dual pulse generating unit and the input data signal when the clock signal falls.

7. The clock-based data storage device as claimed in claim 6, wherein, based on the first clock signal outputted from the dual pulse generating unit and the input data signal when the clock signal falls, the pull-up unit outputs the pull-up output signal to the output port through the first dynamic node when the input data signal is in a low level.

8. The clock-based data storage device as claimed in claim 6, wherein the pull-up unit comprises:

a second pull-up transistor which receives the signal outputted from the first output port of the dual clock generating unit through a gate port and has a source port connected with the power VCC and a drain port connected with the first dynamic node;

a second pass transistor which receives the signal outputted from the first output port of the dual clock generating unit through a gate port and has a source port connected with the data input port, through which the input data signal is input, and a drain port connected with the first dynamic node; and a first output transistor which has a gate port connected with the first dynamic node connecting the drain ports of the second pull-up transistor and the second pass transistor with each other, a source port connected with the power VCC, and a drain port connected with the output port.

9. The clock-based data storage device as claimed in claim 8, wherein the second pull-up transistor and the first output transistor are P-channel transistors, and the second pass transistor is a N-channel transistor.

10. The clock-based data storage device as claimed in claim 2, wherein the pull-down unit includes a second dynamic node which is previously discharged by a signal outputted from the dual pulse generating unit except for the case of the clock signal falling, and outputs the pull-down output signal to the output port through the second dynamic node, based on the second clock signal outputted from the dual pulse generating unit and the input data signal when the clock signal falls.

11. The clock-based data storage device as claimed in claim 10, wherein, based on the second clock signal outputted from the dual pulse generating unit and the input data signal inputted when the clock signal falls, the pull-down unit outputs the pull-down signal to the output port through the second dynamic node when the input data signal is in a high level.

12. The clock-based data storage device as claimed in claim 10, wherein the pull-down unit comprises:

a pull-down transistor which receives a signal, which is outputted from the second output port of the dual clock generating unit, through a gate port, and has a source port connected with ground Gnd and a drain port connected with the second dynamic node;

a third pass transistor which receives a signal, which is outputted from the second output port of the dual clock generating unit, through a gate port, and has a source port connected with the data input unit, through which the input data signal is inputted, and a drain port connected with the second dynamic node; and a second output transistor which has a gate port connected with the second dynamic node connecting the drain ports of the pull-down transistor and the third pass transistor with each other, and has a source port connected with ground Gnd and a drain port connected with the output port.

13. The clock-based data storage device as claimed in claim 12, wherein the third pass transistor is a p-channel transistor, and the second output transistor and the pull-down transistor are N-channel transistors.

14. A dual pulse generating device comprising:

a clock delaying unit having at least one inverter so as to delay a clock signal to generate a delay clock signal; and a clock outputting unit which, when the clock signal shifts, outputs a first clock signal corresponding to inversion of the clock signal through a first outputting port and outputs a second clock signal corresponding to the clock signal through a second outputting port by using the delay clock signal which has been delayed in the clock delaying unit, wherein the clock output unit includes a first pull-up transistor which receives the delay clock signal, which is outputted from the clock delaying unit, through a gate port and has a source port connected with power VCC.

15. The dual pulse generating device as claimed in claim 14, wherein the clock output unit outputs the first clock signal corresponding to inversion of the clock signal and the second clock signal corresponding to the clock signal when the clock signal falls.

16. The dual pulse generating device as claimed in claim 15, wherein the clock output unit outputs a signal corresponding to the second clock signal to the pull-up unit and outputs a signal corresponding to the first clock signal to the pull-down unit except for a case of the clock signal falling.

17. The dual pulse generating device as claimed in claim 15, wherein the clock output unit comprises:

a first pass transistor which receives a delay clock signal, which is outputted from the clock delaying unit, through a gate port, and has a source port connected with the clock input port, into which a clock signal is inputted and a drain port connected with a drain port of the first pull-up transistor;

an inverter which has an input port connected with each drain port of the first pull-up transistor and the first pass transistor and an output port connected with the first output port so as to output the first clock signal which has been inverted; and a keeper transistor which receives the first clock signal outputted from the inverter through a gate port, and has a source port connected with power VCC and a drain port connected with the input port of the inverter and the second output port.

18. The dual pulse generating device as claimed in claim 17, wherein the first pull-up transistor and the keeper transistor are P-channel transistors, and the first pass transistor is an N-channel transistor.

19. A data storage device comprising:
 a pull-up unit including a first dynamic node which is previously charged except for a case of a first clock signal is inputted, based on an inputted clock signal, the pull-up unit outputting a pull-up output signal to an output port, based on an input data signal inputted when the first clock signal is inputted, wherein the pull-up unit includes an output transistor to output the output signal and having a source node coupled to VCC power;
 a pull-down unit including a second dynamic node which is previously discharged except for a case of a second clock signal is inputted, based on the inputted clock signal, the pull-down unit outputting a pull-down output signal to the output port, based on the input data signal inputted when the second clock signal is inputted; and
 a latch unit disposed between the pull-up and pull-down units and the output port so as to store at least one output signal outputted from the pull-up unit and the pull-down unit.

20. The data storage device as claimed in claim 19, wherein, based on the first clock signal and the corresponding inputted input data signal, the pull-up unit outputs the pull-up signal to the output port through the first dynamic node, when the input data signal is in a low level.

21. The data storage device as claimed in claim 19, wherein, based on the second clock signal and the corresponding inputted input data signal, the pull-down unit outputs the pull-down signal to the output port through the second dynamic node, when the input data signal is in a high level.

22. The data storage device as claimed in claim 20, wherein the pull-up unit comprises:

a second pull-up transistor which receives the first clock signal through a gate port, and has a source port connected with power VCC and a drain port connected with the first dynamic node;
 a second pass transistor which receives the first clock signal through a gate port, and has a source port connected with a data input port, into which the input data signal is inputted and a drain port connected with the first dynamic node; and
 a first output transistor which has a gate port connected with the first dynamic node connecting the drain ports of the second pull-up transistor and the second pass transistor with each other, a source port connected with power VCC, and a drain port connected with the output port.

23. The data storage device as claimed in claim 21, wherein the pull-down unit comprises:
 a pull-down transistor which receives the second clock signal through a gate port, and has a source port connected with ground Gnd and a drain port connected with the second dynamic node;
 a third pass transistor which receives the second clock signal through a gate port, and has a source port connected with the data input port, into which the input data signal is inputted, and a drain port connected with the second dynamic node; and
 a second output transistor which has a gate port connected with the second dynamic node connecting the drain ports of the pull-down transistor and the third pass transistor with each other, a source port connected with ground Gnd, and a drain port connected with the output port.

24. The data storage device as claimed in claim 23, wherein the third pass transistor, the second pull-up transistor, and the first output transistor are p-channel transistors, and the second output transistor, the pull-down transistor, and the second pass transistor are N-channel transistors.

* * * * *